(12) United States Patent
Ishii

(10) Patent No.: US 6,646,713 B2
(45) Date of Patent: *Nov. 11, 2003

(54) PROJECTION EXPOSURE APPARATUS AND DEVICE MANUFACTURING METHOD

(75) Inventor: Hiroyuki Ishii, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,087

(22) Filed: Feb. 9, 1999

(65) Prior Publication Data
US 2002/0033934 A1 Mar. 21, 2002

(30) Foreign Application Priority Data

Feb. 12, 1998 (JP) ............................. 10-029742
Jan. 19, 1999 (JP) ............................. 11-010375

(51) Int. Cl.⁷ ........................ G03B 27/52; G03B 27/42; G03B 27/54
(52) U.S. Cl. ............................ 355/30; 355/53; 355/67
(58) Field of Search ............................. 355/30, 52, 53, 355/55, 67, 77; 356/399–401; 359/512

(56) References Cited

U.S. PATENT DOCUMENTS

| | | | | |
|---|---|---|---|---|
| 4,676,614 A | * | 6/1987 | Ohno | ........................ 353/101 |
| 4,690,528 A | * | 9/1987 | Tanimoto et al. | ............ 353/101 |
| 4,773,750 A | | 9/1988 | Bruning | ...................... 353/122 |
| 4,805,000 A | | 2/1989 | Ogawa et al. | ................ 355/43 |
| 4,811,055 A | | 3/1989 | Hirose | ......................... 355/53 |

FOREIGN PATENT DOCUMENTS

| | | | |
|---|---|---|---|
| EP | 0 302 124 | | 2/1989 |
| JP | 61-79228 | * | 4/1986 |
| JP | 361079228 A | * | 4/1986 |
| JP | 62-32613 | | 2/1987 |
| JP | 63-45875 | | 2/1988 |
| JP | 63-302519 | | 12/1988 |
| JP | 1-123238 | | 5/1989 |
| JP | 2-81019 | | 3/1990 |
| JP | 4-30411 | | 2/1992 |
| JP | 4-30412 | | 2/1992 |
| JP | 4-88317 | | 3/1992 |
| JP | 5-210049 | * | 8/1993 |
| JP | 6-38388 | | 5/1994 |
| JP | 7-92424 | | 4/1995 |
| JP | 8-22951 | | 1/1996 |
| JP | 8-305034 | | 11/1996 |
| JP | 9-82601 | | 3/1997 |
| JP | 9-134865 | | 5/1997 |
| JP | 10-27743 | | 1/1998 |
| JP | 10-242048 | | 9/1998 |

*Primary Examiner*—Henry Hung Nguyen
(74) *Attorney, Agent, or Firm*—Fitzpatrick, Cella, Harper & Scinto (57) ABSTRACT

A projection exposure apparatus includes an illumination device for illuminating a mask with laser light from a laser, a projection optical system for projecting a pattern of the mask as illuminated with the laser light, the projection optical system including a plurality of refractive optical elements made of at least two glass materials, wherein interspaces of the refractive optical elements are filled with at least two types of gaseous fluids, while a pressure of each gaseous fluid is kept the same as or substantially the same as the atmospheric pressure, a detection device for detecting a change in atmospheric pressure and for producing an output and a changing device for changing a wavelength of the laser light on the basis of the output of the detecting device. By changing the wavelength of the laser light with the changing device, a change in a predetermined optical characteristic of the projection optical system resulting from a change in the atmospheric pressure can be corrected or reduced.

18 Claims, 6 Drawing Sheets

U.S. PATENT DOCUMENTS

| | | | |
|---|---|---|---|
| 4,825,247 A | * 4/1989 | Kemi et al. | 355/55 |
| 4,905,041 A | 2/1990 | Aketagawa | 355/53 |
| 4,907,021 A | 3/1990 | Yabu | 353/101 |
| 4,922,290 A | * 5/1990 | Yoshitake et al. | 355/53 |
| 4,961,001 A | 10/1990 | Liegel et al. | 250/491.1 |
| 4,968,868 A | 11/1990 | Aketagawa | 219/121.68 |
| 4,974,018 A | 11/1990 | Komoriya et al. | 355/53 |
| 4,998,821 A | 3/1991 | Ohta et al. | 353/122 |
| 5,025,284 A | 6/1991 | Komoriya et al. | 355/53 |
| 5,095,190 A | 3/1992 | Aketagawa et al. | 219/121.78 |
| 5,105,075 A | 4/1992 | Ohta et al. | 250/201.2 |
| 5,119,390 A | 6/1992 | Ohmori | 372/25 |
| 5,163,168 A | 11/1992 | Hirano et al. | 307/265 |
| 5,373,515 A | 12/1994 | Wakabayashi et al. | 372/20 |
| 5,563,411 A | 10/1996 | Kawata et al. | 250/306 |
| 5,596,204 A | 1/1997 | Irie et al. | 250/548 |
| 5,831,715 A | 11/1998 | Takahashi | 355/53 |
| 5,838,426 A | * 11/1998 | Shinonaga et al. | 355/52 |
| 5,883,704 A | * 3/1999 | Nishi et al. | 355/67 |

* cited by examiner

PROJECTION EXPOSURE APPARATUS AND DEVICE MANUFACTURING METHOD

FIELD OF THE INVENTION AND RELATED ART

This invention relates to a projection exposure apparatus and a device manufacturing method. More particularly, the invention is concerned with a projection exposure apparatus having a function for correcting or reducing a change in optical characteristic of a projection optical system due to a change in atmospheric pressure, and with a device manufacturing method for producing devices such as semiconductor chips, liquid crystal devices, image pickup devices or magnetic sensors, for example, by use of such a projection exposure apparatus.

Generally, a projection optical system of a projection exposure apparatus includes refractive optical elements such as, typically, a lens. Due to a change in pressure of air between optical elements of the projection optical system resulting from a change in atmospheric pressure, the refractive index of the air itself changes, which causes a change in relative refractive index of a glass material and the air. This results in a change in optical characteristic of the projection optical system, such as focus position, projection magnification, distortion aberration, spherical aberration, coma aberration, astigmatism, or curvature of field, for example.

Japanese Laid-Open Patent Application, Laid-Open No. 123238/1989 and No. 305034/1996 show a projection exposure apparatus wherein all refractive optical elements used in the projection optical system are made of the same glass material (fused silica), and wherein, by changing the wavelength of KrF excimer laser exposure light (wavelength of 248 nm), the refractive index of the glass material is changed to correct a change in relative refractive index of the glass material and the air due to a change in atmospheric pressure, by which all the optical characteristics such as described above are corrected.

However, in a case where, like a projection exposure apparatus having an ArF excimer laser (wavelength 193 nm), a very fine device pattern should be projected on a resist of a substrate and, to this end, two or more different glass materials such as fused silica and fluorite are used in refractive optical elements of the projection optical system for correction of chromatic aberration. Since these glass materials have different refractive indices and dispersions, changing the wavelength of laser light to change the refractive indices of the glass materials does not contribute to correction of a change in relative refractive index between the glass material and the air due to a change in atmospheric pressure, with respect to all the glass materials used. Thus, good correction of a change in optical characteristic such as described above, ends in failure. Japanese Laid-Open Patent Application, Laid-Open No. 305034/1996, mentioned above discusses a projection optical system having two or more glass materials, simply.

SUMMARY OF THE INVENTION

It is an object of the present invention to provide a projection exposure apparatus by which a change in optical characteristic of a projection optical system having refractive optical elements of two or more glass materials, due to a change in atmospheric pressure, can be reduced.

It is another object of the present invention to provide a device manufacturing method using such a projection exposure apparatus.

It is a further object of the present invention to provide a projection exposure apparatus by which a change in optical characteristic of a projection optical system having refractive optical elements of two or more glass materials, due to a change in atmospheric pressure, can be substantially corrected (reduced to zero or to such a low degree that pattern resolution is not affected thereby).

It is a yet further object of the present invention to provide a device manufacturing method using such a projection exposure apparatus just above.

In accordance with a first aspect of the present invention, there is provided a projection exposure apparatus for projecting a pattern of a mask, illuminated with exposure light, onto a substrate through a projection optical system, characterized by means for changing the wavelength of exposure light to reduce a change in optical characteristic of the projection optical system due to a change in atmospheric pressure, wherein said projection optical system has plural refractive optical elements made by use of two or more glass materials, wherein interspaces of the refractive optical elements are filled with gaseous fluids of a pressure the same as or substantially the same as atmospheric pressure, and wherein a gaseous fluid in at least one interspace differs in refractive index from a gaseous fluid in at least one of the remaining interspaces.

In accordance with a second aspect of the present invention, there is provided a projection exposure apparatus for projecting a pattern of a mask, illuminated with exposure light, onto a substrate through a projection optical system, characterized by means for changing the wavelength of exposure light to substantially correct a change in optical characteristic of the projection optical system due to a change in atmospheric pressure, wherein said projection optical system has plural refractive optical elements made by use of two or more glass materials, wherein interspaces of the refractive optical elements are filled with gaseous fluids of a pressure the same as or substantially the same as atmospheric pressure, and wherein a gaseous fluid in at least one interspace differs in refractive index from a gaseous fluid in at least one of the remaining interspaces.

In accordance with a third aspect of the present invention, there is provided a projection exposure apparatus for projecting a pattern of a mask, illuminated with exposure light, onto a substrate through a projection optical system, characterized by detecting means for detecting a change in atmospheric pressure and wavelength changing means for changing the wavelength of exposure light in accordance with an output of said detecting means, wherein said projection optical system has plural refractive optical elements made by use of two or more glass materials, wherein interspaces of the refractive optical elements are filled with gaseous fluids of a pressure the same as or substantially the same as atmospheric pressure, and wherein a gaseous fluid in at least one interspace differs in refractive index from a gaseous fluid in at least one of the remaining interspaces.

In accordance with a fourth aspect of the present invention, there is provided a projection exposure apparatus for projecting a pattern of a mask, illuminated with exposure light, onto a substrate through a projection optical system, characterized by means for changing the wavelength of exposure light to reduce a change in optical characteristic of the projection optical system due to a change in atmospheric pressure, wherein said projection optical system has plural refractive optical elements made by use of two or more glass materials, wherein interspaces of the refractive optical elements are filled with inert gaseous fluids of a pressure the same as or substantially the same as atmospheric pressure, and wherein a gaseous fluid in at least one interspace differs in refractive index from a gaseous fluid in at least one of the remaining interspaces.

In accordance with a fifth aspect of the present invention, there is provided a projection exposure apparatus for projecting a pattern of a mask, illuminated with exposure light, onto a substrate through a projection optical system, characterized by means for changing the wavelength of exposure light to substantially correct a change in optical characteristic of the projection optical system due to a change in atmospheric pressure, wherein said projection optical system has plural lens elements made by use of two or more glass materials, wherein interspaces of the lens elements are filled with gaseous fluids of a pressure the same as or substantially the same as atmospheric pressure, and wherein a gaseous fluid in at least one interspace differs in refractive index from a gaseous fluid in at least one of the remaining interspaces.

In accordance with a sixth aspect of the present invention, there is provided a projection exposure apparatus for projecting a pattern of a mask, illuminated with exposure light, onto a substrate through a projection optical system, characterized by detecting means for detecting a change in atmospheric pressure and wavelength changing means for changing the wavelength of exposure light in accordance with an output of said detecting means, wherein said projection optical system has plural lens elements made by use of two or more glass materials, wherein interspaces of the lens elements are filled with inert gaseous fluids of a pressure the same as or substantially the same as atmospheric pressure, and wherein a gaseous fluid in at least one interspace differs in refractive index from a gaseous fluid in at least one of the remaining interspaces.

In accordance with a seventh aspect of the present invention, there is provided a device manufacturing method, comprising the steps of:

applying a resist to a wafer; exposing the wafer resist with an image of a device pattern by use of any of the exposure apparatuses as recited above; and developing the resist having been sensitized by the device pattern image.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are lens sectional views, respectively, of comparative examples of a projection optical system, being designed for clarifying advantageous effects of the projection optical system as shown in FIG. 2 and Table 1, wherein

FIGS. 5A and 5B illustrate longitudinal aberrations of the first and second comparative examples of FIGS. 4A and 4B, wherein FIG. 5A shows longitudinal aberration of the first comparative example and FIG. 5B shows longitudinal aberration of the second comparative example.

DESCRIPTION OF THE PREFERRED EMBODIMENTS

Figure 1:
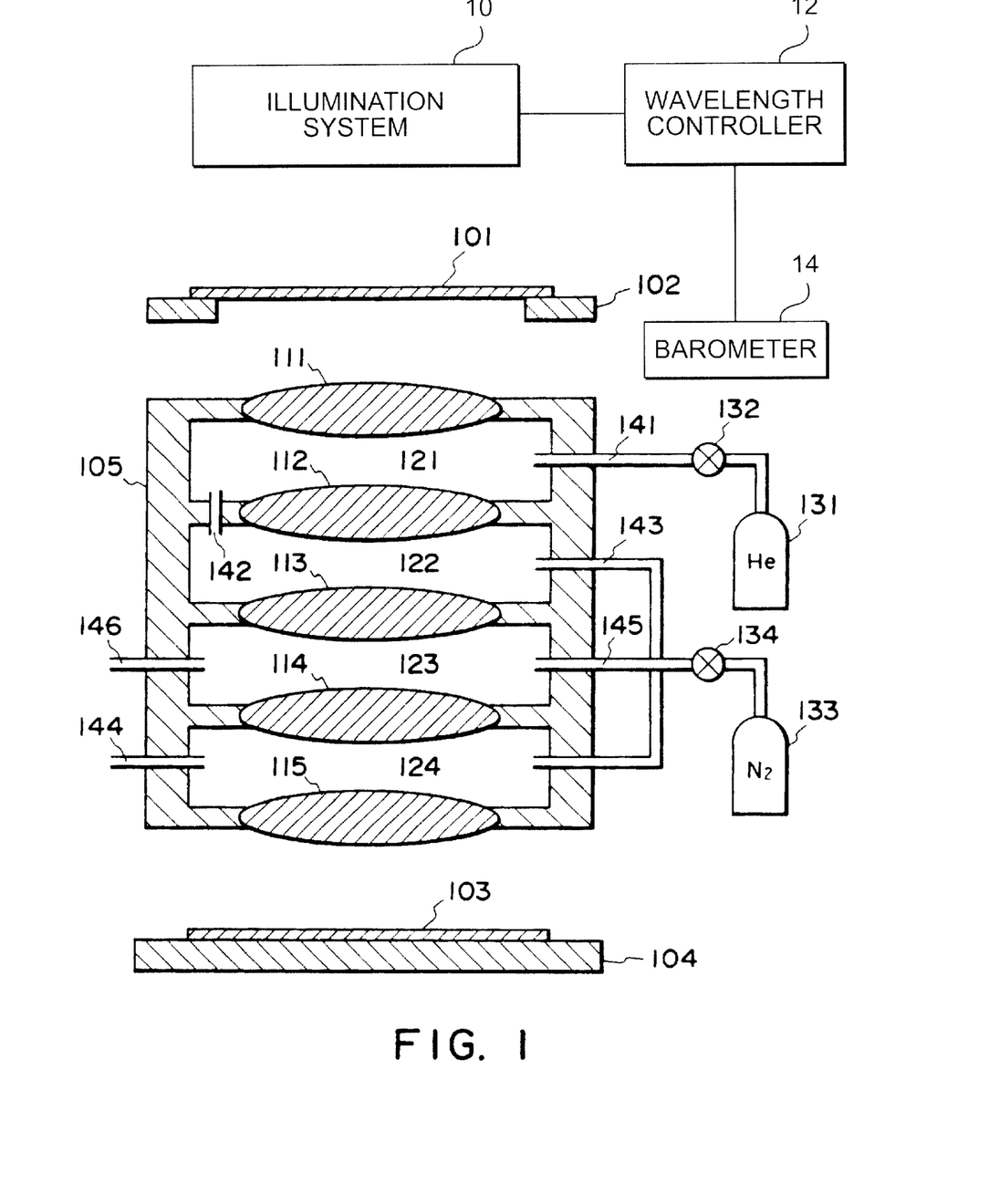
FIG. 1 is a schematic view of a main portion of a projection exposure apparatus according to a first embodiment of the present invention.

FIG. 1 is a schematic view of an embodiment of the present invention.

In FIG. 1, an original of a semiconductor chip (IC or LSI) circuit (hereinafter "circuit pattern") formed on a mask or reticle 101 (hereinafter "mask 101") is illuminated by ArF excimer laser light (wavelength 193 nm) from an illumination system (not shown), with a uniform illuminance distribution. An image of the circuit pattern is projected by a projection optical system 105 onto a wafer 103 which is coated with a resist. The circuit pattern image contains a pattern image of a very fine linewidth not greater than 0.2 micron. The wafer 103 is movable along an optical axis direction of the projection optical system 105 and in desired directions perpendicular to the optical axis direction.

The illumination system 10 of FIG. 1 is arranged to change the wavelength of the ArF excimer laser. It may include a wavelength controller 12, which includes a variable wavelength illumination system and a control system therefor, basically similar to those disclosed in the aforementioned Japanese Laid-Open Patent Application, Laid-Open No. 123238/1989 and No. 305034/1996. Thus, a description of details thereof will be omitted here.

The wavelength of the ArF excimer laser light can be changed by rotating a diffractive grating in a laser resonator, a spectral element such as an etalon or a prism, or a resonator mirror, for example. The rotation angle can be determined by a computer and a predetermined program, in accordance with an output of a barometer 14 for detecting a change in atmospheric pressure.

In FIG. 1, the projection optical system 105 includes a number of lenses (refractive optical elements). The interspaces of these lenses are filled with helium gases or nitrogen gases, in the manner that a gas in at least one interspace differs in respect to a type or refractive index from a gas in at least one of the remaining interspaces. The projection optical system 105 is provided by use of two glass materials of fused silica and fluorite.

More specifically, in the projection optical system 105 of FIG. 1, the interspaces of the lenses 111–113 (i.e., air spacing 121 and air spacing 122) are filled with helium gases, respectively. The interspace of the lenses 113–114 (i.e., air spacing 123) is filled with a nitrogen gas. The interspace of the lenses 114–115 (i.e., air spacing 124) is filled with a helium gas.

Two types of gases (gaseous fluids) filling the lens interspaces, that is, helium gas and nitrogen gas, are selected out of relatively stable inert gases, for avoiding unnecessary chemical reaction by ArF excimer laser light (exposure light), specifically, because they have a large mutual difference in refractive index so that a change in optical characteristic of the projection optical system can be corrected or reduced to being sufficiently small by changing the wavelength of the laser light and because they are relatively inexpensive.

In FIG. 1, a helium gas is supplied by (from) gas reservoir 131, and the flow rate thereof is controlled by a variable valve 132. Then, through a pipe 141, it is introduced into the space of air spacing 121. The space of air spacing 121 and the space of air spacing 122 are communicated with each other by a pipe 142, such that the helium gas in the air spacing 121 is introduced into the space of air spacing 122 through the pipe 142.

Further, the space of air spacing 122 and the space of air spacing 124 are communicated with each other through a pipe 143, such that the helium gas in the space of air spacing 122 is introduced into the space of air spacing 124 through the pipe 143. The spaces of air spacings 121, 122 and 124 are finally opened to the outside air, that is, atmosphere, through a pipe 144, such that the inside spaces of air spacings 121, 122 and 124 as well as the helium gases in the pipes 142 and 143 are maintained at the same pressure as the atmospheric pressure. A change in atmospheric pressure thus causes a change in pressure of them.

Nitrogen gas is supplied from a gas reservoir 133, and the flow rate thereof is controlled by a variable valve 134. Then, through a pipe 145, it is introduced into the space of air spacing 123. The space of air spacing 123 is finally opened to the outside air, that is, atmosphere, by a pipe 146, such that the inside space of air spacing 123 as well as the nitrogen gas in the pipe 145 are maintained at the same pressure as the atmospheric pressure. A change in atmospheric pressure thus causes a change in pressure of them.

As described above, inert gases filling the air spacings of the lenses of the projection optical system are constantly held at the same pressure or substantially the same pressure as the atmospheric pressure. Therefore, without the necessity of a complicated and reinforced barrel structure, the barrel can be filled with inert gases.

In accordance with the structure of a projection exposure apparatus described above, even when the projection optical system 105 includes plural lenses made by use of two glass materials of fused silica and fluorite, a change in optical characteristic of the projection optical system 105 due to a change in atmospheric pressure (pressure change of inert gas) can be corrected or reduced to being sufficiently small, by changing the wavelength of excimer laser light in response to an output of the barometer (atmospheric pressure change). Thus, degradation of performance of the apparatus can be prevented.

Figure 2:
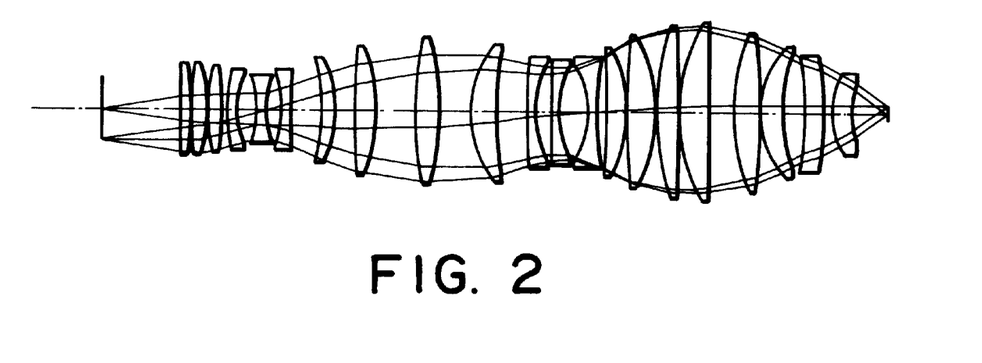
FIG. 2 is a lens sectional view showing an example of projection optical system 105 of the FIG. 1 embodiment.

FIG. 2 is a lens sectional view showing an example of projection optical system 105. The projection optical system of this example has a design wavelength of 193 nm, a projection magnification of ¼, a numerical aperture of 0.60, and an image plane size of ⌀20 mm. Two glass materials of fluorite and fused silica are used therein, for correction of chromatic aberration.

The projection optical system of FIG. 2 is designed in accordance with the present invention, and best imaging performance is attainable on a condition that: the space from the pattern surface of the mask to the first lens is filled with air; the interspaces of the first to thirteenth lenses are filled with helium gases; the interspace of the thirteenth to fourteenth lenses is filled with a nitrogen gas; the interspaces of the fourteenth to twenty-first lenses are filled with helium gases; and the space from the twenty-first lens to the wafer surface is filled by air.

Table 1 shows lens data of the projection optical system of FIG. 2.

TABLE 1

| No. | R | D | N |
|---|---|---|---|
| OBJ | 0.000 | 100.000 | Air |
| 1 | 0.000 | 11.958 | $SiO_2$ |
| 2 | −402.116 | 2.007 | He |
| 3 | 395.023 | 19.132 | $SiO_2$ |
| 4 | −236.446 | 1.681 | He |
| 5 | 259.939 | 16.861 | $SiO_2$ |
| 6 | −480.789 | 8.324 | He |
| 7 | 219.234 | 10.000 | $SiO_2$ |
| 8 | 94.907 | 27.234 | He |
| 9 | −122.460 | 10.000 | $CaF_2$ |
| 10 | 105.727 | 20.559 | He |
| 11 | −123.517 | 10.000 | $CaF_2$ |
| 12 | 752.347 | 39.881 | He |
| 13 | −274.596 | 17.473 | $CaF_2$ |
| 14 | −153.083 | 27.966 | He |
| 15 | 3193.198 | 24.395 | $CaF_2$ |
| 16 | −251.770 | 52.592 | He |
| 17 | 466.125 | 29.129 | $CaF_2$ |
| 18 | −424.124 | 40.974 | He |
| 19 | 136.640 | 33.421 | $CaF_2$ |
| 20 | 525.798 | 38.861 | He |
| 21 | 914.957 | 10.000 | $SiO_2$ |
| 22 | 138.926 | 20.484 | He |
| 23 | −11624.047 | 10.000 | $SiO_2$ |
| 24 | 130.736 | 37.967 | He |
| 25 | −114.177 | 10.000 | $SiO_2$ |
| 26 | 487.595 | 12.417 | $N_2$ |
| 27 | −1681.657 | 26.014 | $CaF_2$ |
| 28 | −192.898 | 2.001 | He |
| 29 | 1533.870 | 35.618 | $CaF_2$ |
| 30 | −211.929 | 1.294 | He |
| 31 | 337.353 | 27.240 | $CaF_2$ |
| 32 | 30759.271 | 1.000 | He |
| 33 | 249.943 | 36.042 | $CaF_2$ |
| 34 | −11874.873 | 34.428 | He |
| 35 | 298.757 | 31.905 | $CaF_2$ |
| 36 | −1073.124 | 1.013 | He |
| 37 | 115.013 | 29.218 | $CaF_2$ |
| 38 | 201.760 | 27.053 | He |
| 39 | −372.793 | 25.000 | $SiO_2$ |
| 40 | −596.730 | 9.809 | He |
| 41 | 93.679 | 24.542 | $CaF_2$ |
| 42 | 125.530 | 44.507 | Air |
| IMG | 0.000 | 0.000 | |

As shown in Table 1, in the projection optical system, the fifth to tenth lenses and the fourteenth to nineteenth lenses as well as the twenty-first lens are made of fluorite. The first to fourth lenses and the eleventh to thirteenth lenses as well as the twentieth lens are made of fused silica. The space of air spacing between the silica lens of the thirteenth lens and the fluorite lens of the fourteenth lens is filled with a nitrogen gas, while all the remaining air spacings are filled with helium gases.

Figure 3:
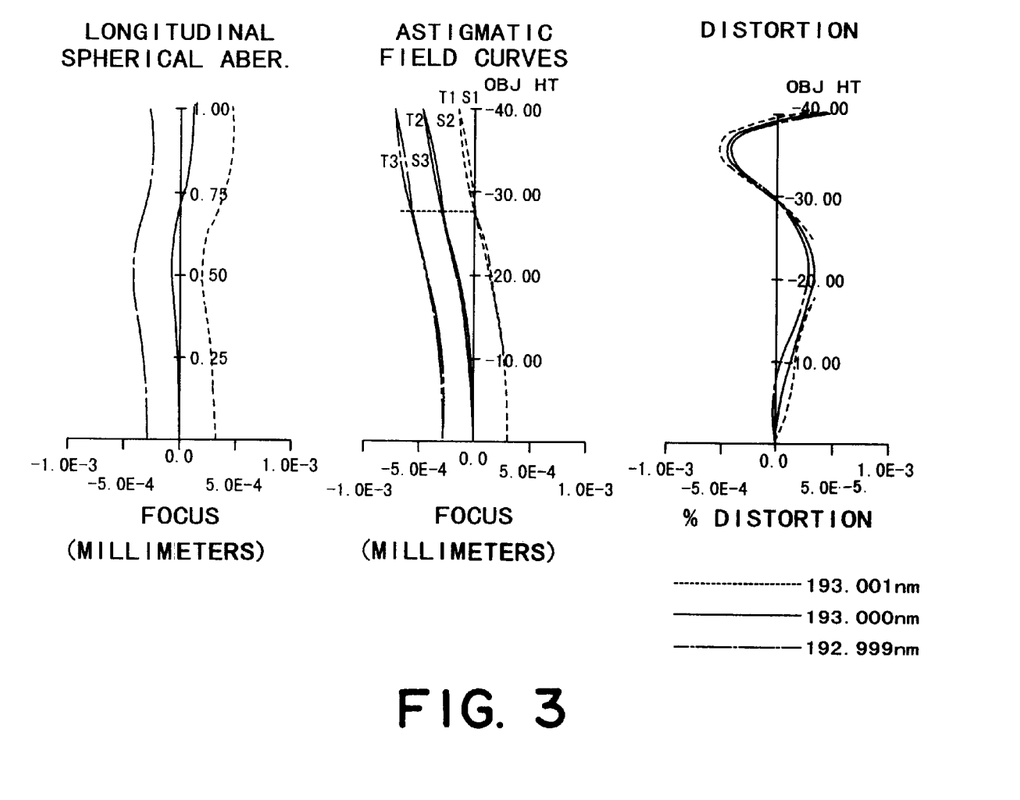
FIG. 3 illustrates longitudinal aberrations of a projection optical system shown in FIG. 2 and Table 1.

FIG. 3A illustrates longitudinal aberration, for explaining the imaging performance of this projection optical system.

Table 2 shows refractive indices of lenses of the projection optical system, in relation to changes in atmospheric pressure and changes in wavelength. In preparation of Table 2, a calculation has been made on an assumption that a change in refractive index of the lens (glass material) as the wavelength changes by a sufficiently small amount, is proportional to a change in wavelength. The reason why the refractive index of the helium gas or nitrogen gas does not change in response to a change in wavelength is that the amount of change of refractive index is very small, less than the effective digit.

TABLE 2

| GLASS MATERIAL/ GAS | PRESSURE (hPa) | WAVELENGTH USED (nm) | | |
|---|---|---|---|---|
| | | 193.001 | 193.000 | 192.999 |
| $SiO_2$ | | 1.5607984 | 1.5608000 | 1.5608016 |
| $CaF_2$ | | 1.5018990 | 1.5019000 | 1.5019010 |
| Air | 1013 | 1.0003000 | 1.0003000 | 1.0003000 |
| | 1063 | 1.0003158 | 1.0003158 | 1.0003158 |
| $N_2$ | 1013 | 1.0003000 | 1.0003000 | 1.0003000 |
| | 1063 | 1.0003157 | 1.0003157 | 1.0003157 |
| He | 1013 | 1.0000300 | 1.0000300 | 1.0000300 |
| | 1063 | 1.0000317 | 1.0000317 | 1.0000317 |

Two comparative examples will now be described, for demonstrating the advantageous effects of the present embodiment wherein spaces of air spacings of a projection optical system are filled (or purged) with helium gas and nitrogen gas.

The first comparative example is one in which spaces of all the air spacings in a projection optical system are filled (purged) with nitrogen gases, and the second comparative example is one in which spaces of all the air spacings in a projection optical system are filled (purged) with helium gases. The form in which spaces of all the air spacings of a projection optical system are filled with helium gases is disclosed in Japanese Published Patent Application, Publication No. 38388/1994.

In both of the first and second comparative examples, the projection optical system has substantially the same structure as that of the projection optical system of the present embodiment, and the imaging performance thereof in relation to design wavelength is also similar to that of the projection optical system of this embodiment.

Figure 4A:
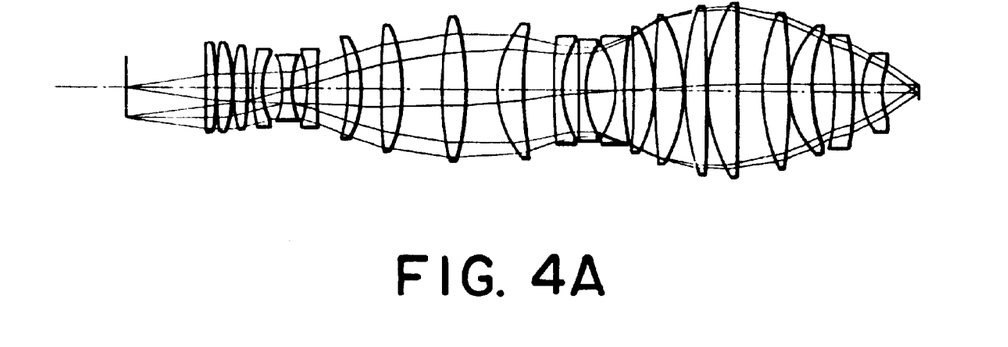
FIG. 4A is a lens sectional view of a first comparative example and FIG. 4B is a lens sectional view of a second comparative example.
Figure 4B:
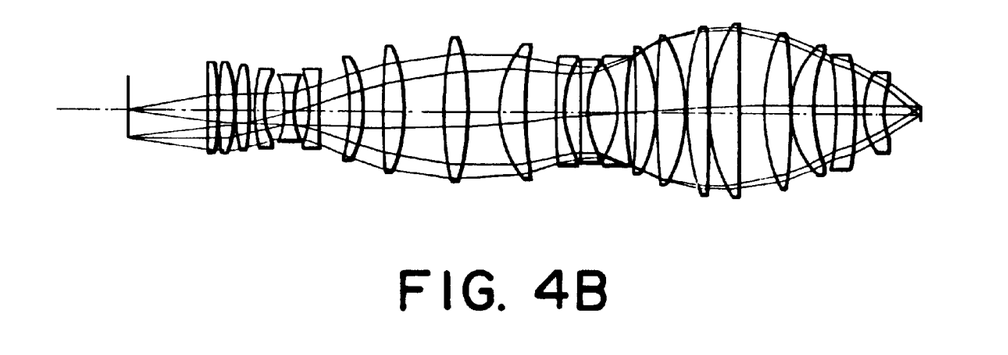
Figure 5A:
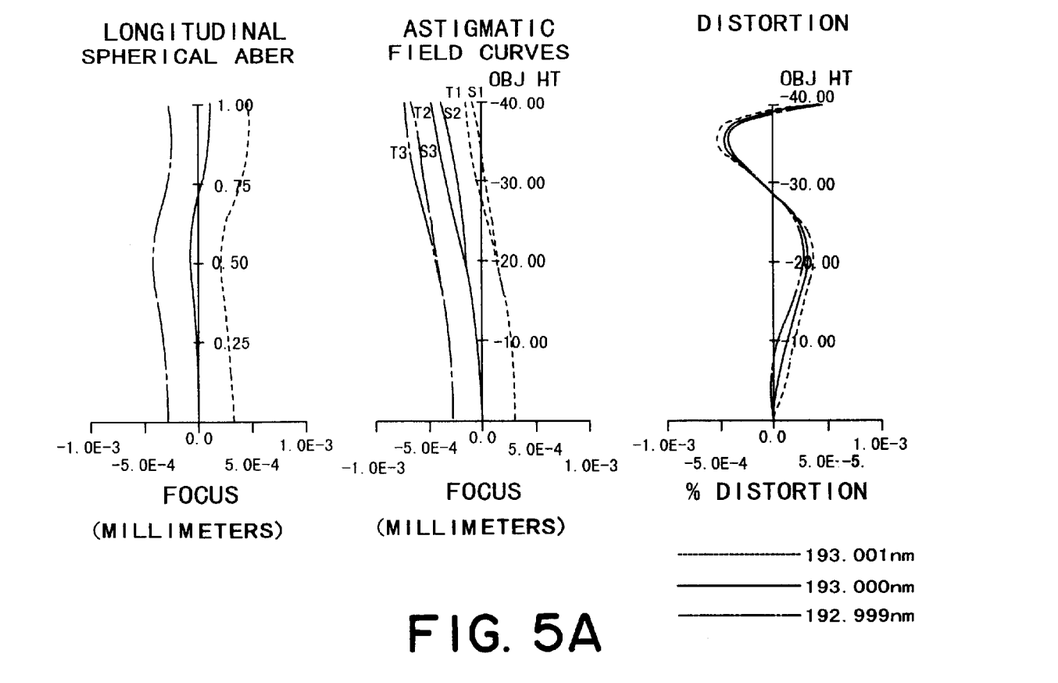
Figure 5B:
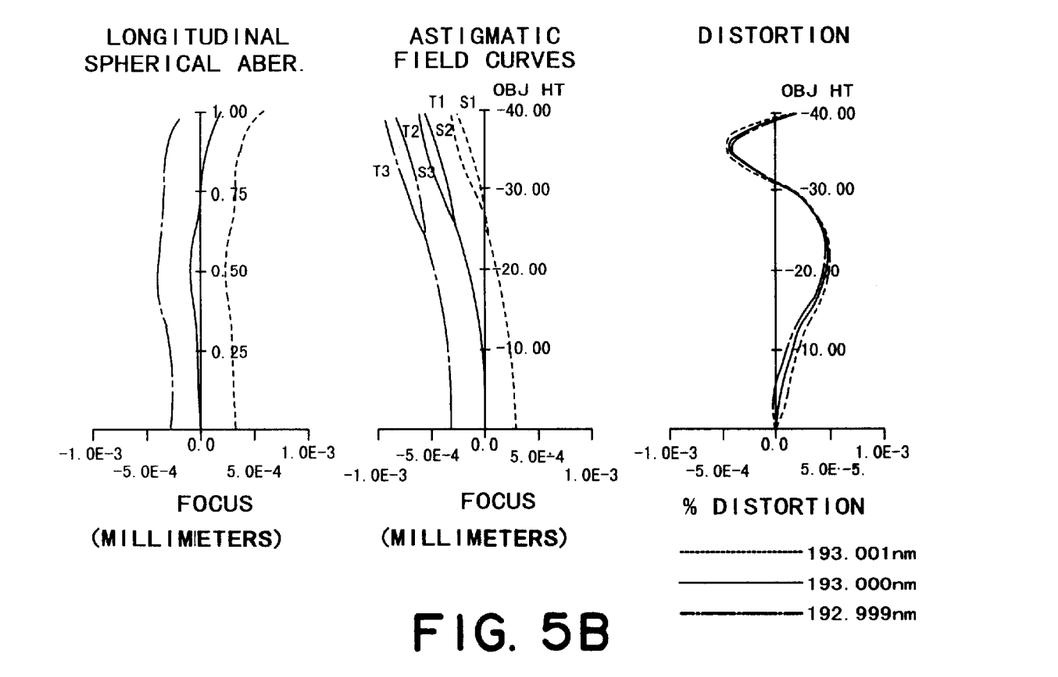

In regard to the first comparative example, FIG. 4A is a lens sectional view thereof, and Table 3A shows the lens data thereof. FIG. 5A shows a longitudinal aberration thereof. In regard to the second comparative example, FIG. 4B is a lens sectional view thereof, and Table 3B shows the design values thereof. FIG. 5B shows a longitudinal aberration thereof.

On the other hand, advantageous effects of this embodiment are best seen in Table 4. Table 4 shows aberration of the projection optical system without a change in atmospheric pressure, aberration which results from changing the wavelength of laser light for correction of aberration produced when the atmospheric pressure changes by +50 hPa, and remaining aberration (correction remainder) which corresponds to the difference between the former two aberrations and which remains when a change in aberration due to a change in atmospheric pressure is corrected by changing the laser light wavelength as the atmospheric pressure changes by +50 hPa.

In the calculation example of Table 4, in this embodiment, the amount of changing the wavelength for correcting a change in aberration due to a change in atmospheric pressure is determined so as to correct (to reduce to zero) the spherical aberration (a change thereof) resulting from the atmospheric pressure change.

TABLE 3A

| No. | R | D | N |
|---|---|---|---|
| OBJ | 0.000 | 100.000 | Air |
| 1 | 0.000 | 11.958 | $SiO_2$ |

TABLE 3A-continued

| No. | R | D | N |
|---|---|---|---|
| 2 | −402.116 | 2.113 | $N_2$ |
| 3 | 395.023 | 19.132 | $SiO_2$ |
| 4 | −236.446 | 1.127 | $N_2$ |
| 5 | 259.939 | 16.861 | $SiO_2$ |
| 6 | −480.789 | 8.671 | $N_2$ |
| 7 | 219.234 | 10.000 | $SiO_2$ |
| 8 | 94.907 | 27.143 | $N_2$ |
| 9 | −122.460 | 10.000 | $CaF_2$ |
| 10 | 105.727 | 20.553 | $N_2$ |
| 11 | −123.517 | 10.000 | $CaF_2$ |
| 12 | 752.347 | 40.814 | $N_2$ |
| 13 | −274.596 | 17.473 | $CaF_2$ |
| 14 | −153.083 | 25.874 | $N_2$ |
| 15 | 3193.198 | 24.395 | $CaF_2$ |
| 16 | −251.770 | 54.799 | $N_2$ |
| 17 | 466.125 | 29.129 | $CaF_2$ |
| 18 | −424.124 | 40.000 | $N_2$ |
| 19 | 136.640 | 33.421 | $CaF_2$ |
| 20 | 525.798 | 38.940 | $N_2$ |
| 21 | 914.957 | 10.000 | $SiO_2$ |
| 22 | 138.926 | 20.487 | $N_2$ |
| 23 | −11624.047 | 10.000 | $SiO_2$ |
| 24 | 130.736 | 37.945 | $N_2$ |
| 25 | −114.177 | 10.000 | $SiO_2$ |
| 26 | 487.595 | 12.438 | $N_2$ |
| 27 | −1681.657 | 26.014 | $CaF_2$ |
| 28 | −192.898 | 2.213 | $N_2$ |
| 29 | 1533.870 | 35.618 | $CaF_2$ |
| 30 | −211.929 | 1.021 | $N_2$ |
| 31 | 337.353 | 27.240 | $CaF_2$ |
| 32 | 30759.271 | 1.095 | $N_2$ |
| 33 | 249.943 | 36.042 | $CaF_2$ |
| 34 | −11874.873 | 34.440 | $N_2$ |
| 35 | 298.757 | 31.905 | $CaF_2$ |
| 36 | −1073.124 | 1.000 | $N_2$ |
| 37 | 115.013 | 29.218 | $CaF_2$ |
| 38 | 201.760 | 27.070 | $N_2$ |
| 39 | −372.793 | 25.000 | $SiO_2$ |
| 40 | −596.730 | 9.655 | $N_2$ |
| 41 | 93.679 | 24.542 | $CaF_2$ |
| 42 | 125.530 | 44.654 | Air |
| IMG | 0.000 | 0.000 | |

TABLE 3B

| No. | R | D | N |
|---|---|---|---|
| OBJ | 0.000 | 100.000 | Air |
| 1 | 0.000 | 11.958 | $SiO_2$ |
| 2 | −402.116 | 2.115 | He |
| 3 | 395.023 | 19.132 | $SiO_2$ |
| 4 | −236.446 | 1.000 | He |
| 5 | 259.939 | 16.861 | $SiO_2$ |
| 6 | −480.789 | 8.673 | He |
| 7 | 219.234 | 10.000 | $SiO_2$ |
| 8 | 94.907 | 27.090 | He |
| 9 | −122.460 | 10.000 | $CaF_2$ |
| 10 | 105.727 | 21.251 | He |
| 11 | −123.517 | 10.000 | $CaF_2$ |
| 12 | 752.347 | 39.848 | He |
| 13 | −274.596 | 17.473 | $CaF_2$ |
| 14 | −153.083 | 27.418 | He |
| 15 | 3193.198 | 24.395 | $CaF_2$ |
| 16 | −251.770 | 52.319 | He |
| 17 | 466.125 | 29.129 | $CaF_2$ |
| 18 | −424.124 | 40.249 | He |
| 19 | 136.640 | 33.421 | $CaF_2$ |
| 20 | 525.798 | 38.887 | He |
| 21 | 914.957 | 10.000 | $SiO_2$ |
| 22 | 138.926 | 20.507 | He |
| 23 | −11624.047 | 10.000 | $SiO_2$ |
| 24 | 130.736 | 38.010 | He |
| 25 | −114.177 | 10.000 | $SiO_2$ |
| 26 | 487.595 | 12.223 | $N_2$ |

TABLE 3B-continued

| No. | R | D | N |
|---|---|---|---|
| 27 | −1681.657 | 26.014 | CaF$_2$ |
| 28 | −192.898 | 2.327 | He |
| 29 | 1533.870 | 35.618 | CaF$_2$ |
| 30 | −211.929 | 1.000 | He |
| 31 | 337.353 | 27.240 | CaF$_2$ |
| 32 | 30759.271 | 1.000 | He |
| 33 | 249.943 | 36.042 | CaF$_2$ |
| 34 | −11874.873 | 34.717 | He |
| 35 | 298.757 | 31.905 | CaF$_2$ |
| 36 | −1073.124 | 1.083 | He |
| 37 | 115.013 | 29.218 | CaF$_2$ |
| 38 | 201.760 | 27.045 | He |
| 39 | −372.793 | 25.000 | SiO$_2$ |
| 40 | −596.730 | 9.712 | He |
| 41 | 93.679 | 24.542 | CaF$_2$ |
| 42 | 125.530 | 44.577 | Air |
| IMG | 0.000 | 0.000 | |

In this embodiment, the amount of changing the wavelength of exposure light for correcting a change in optical characteristic due to a change in atmospheric pressure is set to completely correct a change in spherical aberration to zero (though it may not be to zero). However, the amount of changing the wavelength may be set so as to correct or sufficiently make small a change in optical characteristic other than spherical aberration (a change in other aberration such as coma, curvature of field, astigmatism, or distortion, for example). Alternatively, it may be set so as to correct or reduce changes of plural aberrations among spherical aberration, coma, curvature of field, astigmatism and distortion.

Namely, the amount of changing the wavelength may not be set to sufficiently correct or reduce the amount of change of only one particular optical characteristic. For example, an optimum amount of wavelength change for correcting or sufficiently making small changes of plural optical characteristics, such as plural aberrations, may be selected.

In this embodiment, selection of air spacings of the projection optical system to be filled with inert gases and

TABLE 4

| | | MAGNIFI-CATION ppm | IMAGE PLANE (S) μm | IMAGE PLANE (M) μm | SPHERICAL ABERRATION λ | COMA λ | WAVELENGTH CHANGE pm |
|---|---|---|---|---|---|---|---|
| ALL N$_2$ PURGE | ORIGINAL | 0.00 | −0.387 | −0.465 | 0.003 | −0.026 | |
| | PRESSURE CHANGE CORRECTION | 7.38 | −0.423 | −0.423 | 0.003 | −0.290 | −22.38 |
| | ABERRATION CORRECTION REMAINDER | 7.37 | −0.036 | 0.042 | 0.000 | −0.264 | |
| ALL He PURGE | ORIGINAL | 0.00 | −0.508 | −0.572 | 0.006 | −0.054 | |
| | PRESSURE CHANGE CORRECTION | −3.91 | −0.513 | −0.576 | 0.006 | −0.120 | −3.54 |
| | ABERRATION CORRECTION REMAINDER | −3.91 | −0.005 | −0.004 | 0.000 | −0.066 | |
| N$_2$ PURGE BETWEEN 26TH AND 27TH SURFACES | ORIGINAL | 0.00 | −0.506 | −0.489 | 0.003 | −0.037 | |
| | PRESSURE CHANGE CORRECTION | −2.31 | −0.510 | −0.487 | 0.003 | −0.059 | −2.16 |
| | ABERRATION CORRECTION REMAINDER | −2.31 | −0.004 | 0.002 | 0.000 | −0.022 | |

It is seen from Table 4 that a correction remainder of coma aberration of a projection optical system in which spaces of all the air spacings are purged with nitrogen gases (first comparative example) is −0.264λ, whereas a correction remainder of coma aberration of a projection optical system in which spaces of all the air spacings are purged with helium gases (second comparative example) is −0.066λ, being reduced to about ¼ as compared with the first comparative example.

However, the amount of variation of coma aberration of a value 0.066λ is undesirable for projection of a fine image of 0.2 micron or less, as in the projection exposure apparatus of FIG. 1.

On the other hand, the correction remainder of coma aberration in this embodiment is only −0.022λ, being reduced to about 1/12 as compared with the first comparative example and to about ⅓ as compared with the second comparative example. Additionally, in accordance with this embodiment the, correction remainder such as of magnification and curvature of field, for example, is reduced significantly as compared with the first and second comparative example.

selection of materials for inert gases filling the air spacings are so determined as to totally minimize the aberration correction remainder. However, when separate aberration correcting means for correcting a particular aberration or aberrations is used, a determination of materials of inert gases and a determination of spaces to be filled with gases may be made without taking into account the correction remainder of the particular aberration to be corrected by the separate aberration correcting means. They may be made in consideration of a correction remainder of aberration or aberrations not to be corrected by the separate aberration correcting means.

For example, in a case where a projection exposure apparatus is equipped with a correction optical system for correcting spherical aberration of a projection optical system (Japanese Laid-Open Patent Application, Laid-Open No. 92424/1995), in a case where a projection exposure apparatus is equipped with a correction optical system for correcting projection magnification and distortion of a projection optical system (Japanese Laid-Open Patent Application, Laid-Open No. 81019/1990 or No. 88317/1992), in a case where a projection exposure apparatus is equipped with a correction optical system for correcting on-axis and off-axis astigmatisms of a projection optical system (Japanese Laid-Open Patent Application, Laid-Open No. 27743/1998 or No. 242048/1998), in a case where a projection exposure apparatus is equipped with a correction optical system for correcting coma aberration of a projection optical system (Japanese Laid-Open Patent Application, Laid-Open No. 22951/1996), or in a case where a projection exposure apparatus is equipped with a correction optical system for correcting a curvature of field of a projection optical system (Japanese Laid-Open Patent Application, Laid-Open No. 242048/1998), aberration corresponding to such a correction optical system can be corrected thereby. Therefore, even if a change in atmospheric pressure or a change in laser light wavelength causes a change in optical characteristic related to the correction optical system, used it does not raise a problem. Thus, a selection of inert gases and selection of spaces to be filled with gases may be made so as to reduce correction remainder of other optical characteristics (aberrations) not compensated for by the correction optical system.

In this embodiment, two different inert gases of helium and nitrogen are used for gaseous fluids for filling the spaces of different air spacings of a projection optical system. However, two inert gases other than these gases may be used. Alternatively, three or more different inert gases may be used. As a further alternative, air and one or more different inert gases may be used.

The gaseous fluid filling an air spacing is not limited to a single gas material. It may be a mixed gas of different gaseous fluids such as a gas of a mixture of helium and nitrogen.

In the projection optical system of this embodiment, the space of one air spacing is filled with nitrogen gas while spaces of all the remaining air spacings are filled with helium gases. However, the optical system may be modified so that plural air spacings are filled with nitrogen gases.

The projection optical system of this embodiment is not limited to an optical system consisting of plural lenses. It may comprise an optical system having lenses and a concave mirror.

In the embodiments of the present invention described hereinbefore, a light source comprises an ArF excimer laser. However, a light source for providing exposure light of a wavelength of 250 nm or shorter, such as a KrF excimer laser (wavelength of about 248 nm) may be used. The present invention is applicable also to a projection optical system having its design wavelength set with respect to the wavelength of such a light source.

The projection exposure apparatus of this embodiment is applicable to a step-and-repeat type or step-and-scan type stepper.

Figure 6:
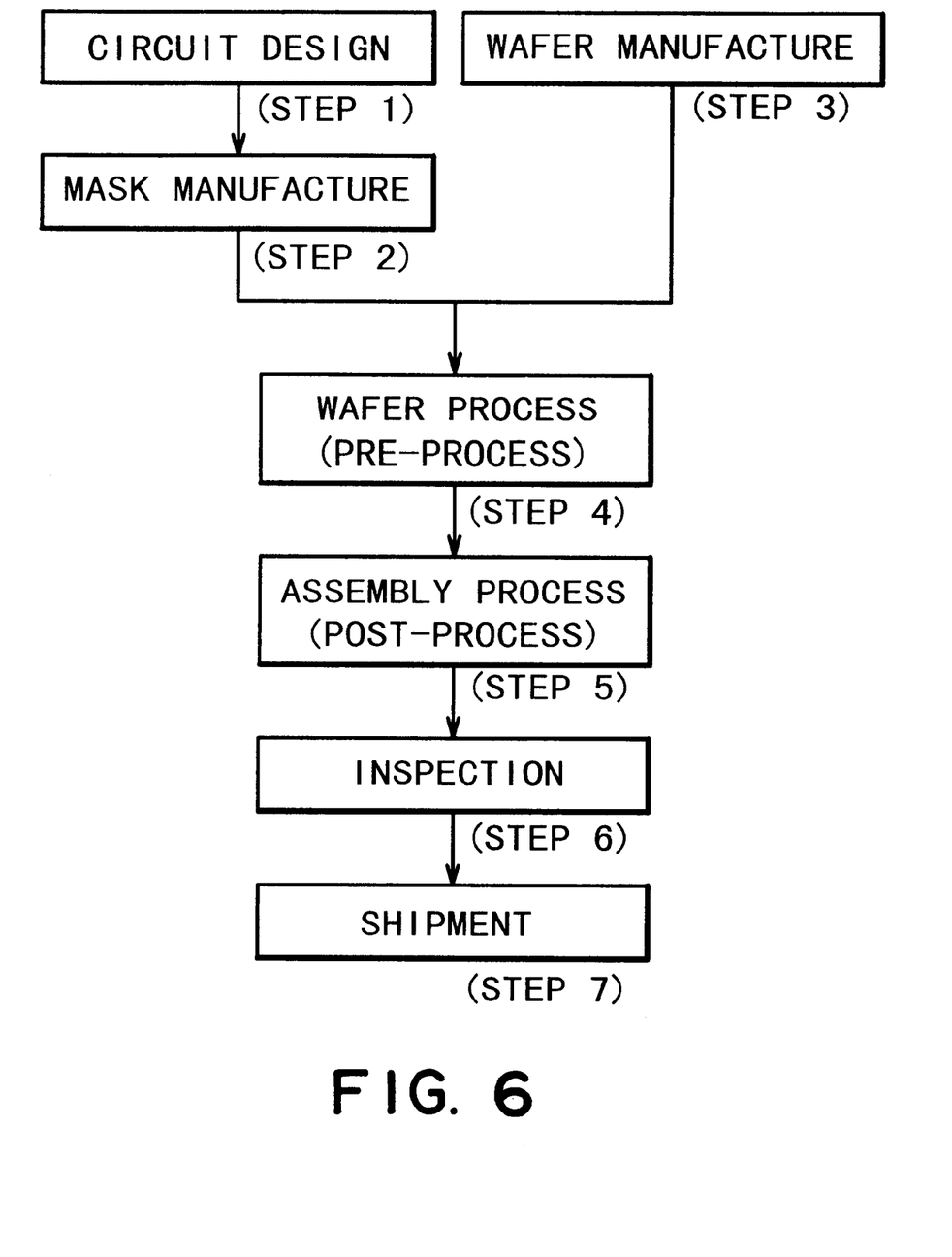
FIG. 6 is a flow chart of semiconductor device manufacturing processes.
Figure 7:
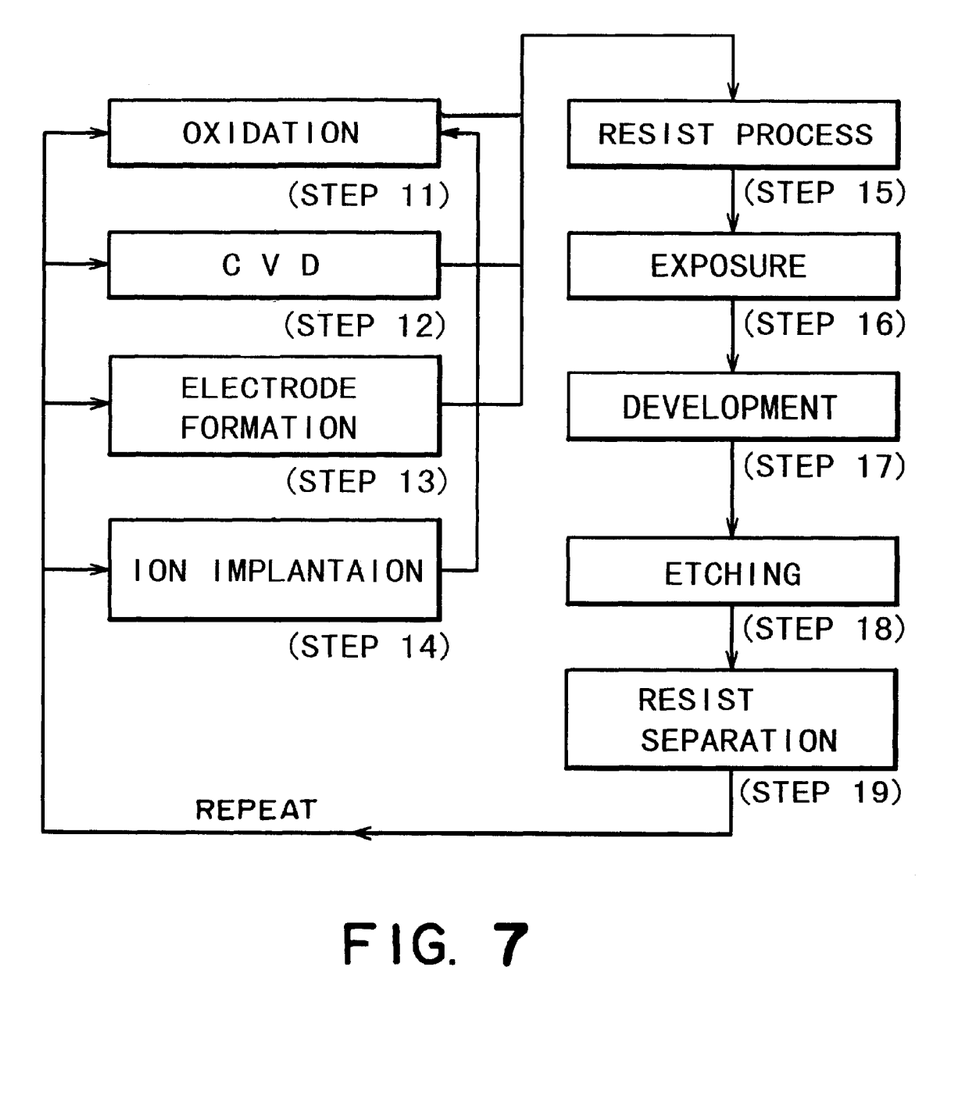
FIG. 7 is a flow chart of a wafer process in the procedure of FIG. 6.

FIG. 6 is a flow chart for illustrating a semiconductor device manufacturing procedure, and FIG. 7 is a flow chart for explaining a wafer process in the procedure of FIG. 6. A projection exposure apparatus according to any one of the embodiments described above can be used in an "exposure" step of FIG. 7. By this, if the atmospheric pressure changes, even a very small linewidth pattern image of 0.2 micron or less, of a device pattern image, can be resolved satisfactorily and, therefore, a semiconductor device of a very large degree of integration can be produced.

In accordance with the embodiments of the present invention described hereinbefore, a change in optical characteristic of a projection optical system due to a change in atmospheric pressure can be reduced or substantially corrected. Thus, the present invention provides a projection exposure apparatus or a device manufacturing method by which, regardless of an atmospheric pressure change, even a very small linewidth pattern image of 0.2 micron or less, of a device pattern image, can be resolved satisfactorily.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus comprising:
    illumination means for illuminating a mask with laser light from a laser;
    a projection optical system for projecting a pattern of the mask as illuminated with the laser light, said projection optical system including a plurality of refractive optical elements made of at least two materials, wherein interspaces of the refractive optical elements are filled with at least two different types of gaseous fluids, while a pressure of each gaseous fluid is kept the same as or substantially the same as the atmospheric pressure, the at least two different types of gaseous fluids filling different interspaces, respectively, wherein the gaseous fluids are a helium gas and a nitrogen gas;
    detecting means for detecting a change in atmospheric pressure and for producing an output; and
    changing means for changing a wavelength of the laser light on the basis of the output of said detecting means, wherein, by changing the wavelength of the laser light with said changing means, a change in a predetermined optical characteristic of said projection optical system resulting from a change in the atmospheric pressure can be corrected or reduced.

2. An apparatus according to claim 1, wherein said refractive optical elements are made of $SiO_2$ and $CaF_2$.

3. An apparatus according to claim 1, wherein said gaseous fluids consist of inactive gases.

4. An apparatus according to claim 1, wherein the predetermined optical characteristic is at least one of spherical aberration, coma, distortion, astigmatism, and curvature of image.

5. An apparatus according to claim 4, wherein the wavelength of the laser light is not longer than 250 nm.

6. An apparatus according to claim 5, wherein the wavelength of the laser light is not longer than 200 nm.

7. An apparatus according to claim 6, wherein the laser comprises an excimer laser.

8. An apparatus according to claim 1, wherein the gaseous fluids each consists of one of a single gaseous fluid and a mixture of different gaseous fluids.

9. An apparatus according to claim 1, further comprising a correction optical system for correcting a spherical aberration among optical characteristics of said projection optical system, which is changeable with a change in the atmospheric pressure.

10. An apparatus according to claim 1, further comprising a driving mechanism for moving a substrate, to be exposed with the pattern of the mask, in an optical axis direction of said projection optical system so as to substantially correct a focus position among optical characteristics of said projection optical system, which is changeable with a change in the atmospheric pressure.

11. An apparatus according to claim 1, further comprising a correction optical system for correcting a projection magnification of said projection optical system, which is changeable with a change in the atmospheric pressure.

12. An apparatus according to claim 1, further comprising a correction optical system for correcting a distortion aberration of said projection optical system, which is changeable with a change in the atmospheric pressure.

13. An apparatus according to claim 1, further comprising a correction optical system for correcting an astigmatism aberration of said projection optical system, which is changeable with a change in the atmospheric pressure.

14. An apparatus according to claim 1, further comprising a correction optical system for correcting a curvature of image of said projection optical system, which is changeable with a change in the atmospheric pressure.

15. An apparatus according to claim 1, further comprising a correction optical system for correcting a coma aberration of said projection optical system, which is changeable with a change in the atmospheric pressure.

16. An apparatus according to claim 1, wherein the gaseous fluids have different pressures.

17. An apparatus according to claim 1, wherein said gaseous fluids are gaseous fluids of a refractive index of one.

18. A device manufacturing method, comprising the steps of:

exposing a resist of a wafer with a device pattern of a mask, by use of an exposure apparatus as recited in claim 1; and     developing the exposed resist of the wafer.

\* \* \* \* \*